(12) United States Patent
Ishio et al.

(10) Patent No.: US 8,297,784 B2
(45) Date of Patent: Oct. 30, 2012

(54) SURFACE-EMISSION UNIT AND METHOD FOR PRODUCING THE SAME

(75) Inventors: Toshiya Ishio, Osaka (JP); Mitsuru Hineno, Osaka (JP); Nobuo Ogata, Osaka (JP); Shinji Suminoe, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 227 days.

(21) Appl. No.: 12/835,492

(22) Filed: Jul. 13, 2010

(65) Prior Publication Data

US 2011/0013393 A1 Jan. 20, 2011

(30) Foreign Application Priority Data

Jul. 14, 2009 (JP) ................................. 2009-166148

(51) Int. Cl.
*F21V 1/00* (2006.01)
(52) U.S. Cl. .................. 362/235; 362/244; 362/249.01; 362/249.02
(58) Field of Classification Search .................. 362/235, 362/244, 249.01, 249.02, 237, 240
See application file for complete search history.

(56) References Cited

U.S. PATENT DOCUMENTS

| 6,637,921 B2 * | 10/2003 | Coushaine ..................... 362/517 |
| 7,857,497 B2 * | 12/2010 | Koike et al. ................... 362/545 |
| 2008/0100773 A1 * | 5/2008 | Hwang et al. ................... 349/62 |
| 2008/0101066 A1 * | 5/2008 | Takekuma et al. ............. 362/240 |
| 2008/0106897 A1 * | 5/2008 | Yoon et al. ..................... 362/235 |
| 2008/0298060 A1 | 12/2008 | Ohkawa |

FOREIGN PATENT DOCUMENTS

JP 2008-305940 A 12/2008

* cited by examiner

*Primary Examiner* — Evan Dzierzynski
(74) *Attorney, Agent, or Firm* — Birch, Stewart, Kolasch & Birch, LLP

(57) ABSTRACT

A surface-emission unit to prevent irregularity in brightness from being generated is provided. The surface-emission unit is composed of light-emission element parts each having a light-emission element, aligned and arranged on a substrate two-dimensionally, and optical lenses each arranged on the substrate with respect to each light-emission element part, to diffuse light from the light-emission element, and a support part to fix the optical lens onto the substrate is arranged so as not overlap a line connecting the light-emission element part corresponding to the optical lens fixed by the support part, to another light-emission element part adjacent to the light-emission element part.

10 Claims, 14 Drawing Sheets

_US 8,297,784 B2_

SURFACE-EMISSION UNIT AND METHOD FOR PRODUCING THE SAME

CROSS REFERENCE TO RELATED APPLICATION

This Nonprovisional application claims priority under 35 U.S.C. §119(a) on Patent Application No. 2009-166148 filed in Japan on 14 Jul., 2009 the entire contents of which are hereby incorporated by reference.

BACKGROUND OF THE INVENTION

1. Field of the Invention

The present invention relates to a surface-emission unit used in a backlight unit for a liquid crystal display device or a lighting equipment, and composed of a light-emission element module having a light-emission element, and a method for producing the same.

2. Description of the Related Art

Since a liquid crystal display device such as a liquid crystal television or a liquid crystal monitor does not emit light from the liquid crystal itself, it needs a light source to emit light from a back surface for display. As the light source, a solid-state light-emission element such as a fluorescent tube or an LED (Light Emitting Diode) is used, and in either case, it needs to be designed such that uniform light can be obtained in a display area.

FIG. 14 shows a conventionally used configuration of a substrate on which a light-emission element is mounted (light-emission element module). As disclosed in Japanese Unexamined Patent Publication No. 2008-305940, an LED 5 is directly provided on a substrate 11, and the substrate 11 and the LED 5 are connected by a wire 8, and a cap 41 provided by integrally molding a lens part 41a and a reflector part 41b is bonded with a bonding resin 32 in order to protect the LED 5 and the wire 8 on the substrate, and a transparent sealing resin 42 is applied into the cap 41 and cured by heat, whereby the module is completed.

However, in the case of the above conventional technique, the cap is fixed to the substrate 11 with the bonding resin 32 over a whole bottom surface of the cap 41. At this time, in a case where the bonding resin is liquid, since it is necessary to apply the bonding resin 32 to the bottom surface of the cap 41 or a region of the substrate 11 corresponding to the shape of the bottom surface of the cap, it takes time to apply the resin. In addition, an amount of needed bonding resin increases. In a case of a sheet-shaped or tape-shaped bonding material also, it needs a relatively large bonding area. Therefore, it is thought that without applying the resin to the whole bottom surface of the cap 41, the resin is only applied to a part of bottom surface of the cap 41 or the region on the substrate 11 corresponding to the shape of the bottom surface of the cap, in the shape of a dot.

However, in this case, a shadow is formed when the bonding resin shields the light from the light-emission element. The shadows overlap with each other and are emphasized depending on the way of arranging the light-emission elements, so that linear irregularity in brightness is generated in the surface-emission unit used in the liquid crystal television, liquid crystal monitor, or surface emission type lighting equipment.

SUMMARY OF THE INVENTION

The present invention was made in view of the problem in the above conventional technique, and it is an object of the present invention to provide a surface-emission unit in which a bonding part of a bonding resin is reduced, and irregularity in brightness is prevented from being generated.

As a first characteristic, a surface-emission unit according to the present invention to solve the above problem comprises: a plurality of light-emission element parts each including a light-emission element, aligned and arranged on a substrate two-dimensionally, and a plurality of optical lenses each arranged on the substrate with respect to each of the light-emission element parts, to diffuse light from the light-emission element, and characterized in that each of the optical lens is fixed onto the substrate through one or more support parts, and each of the support parts is arranged so as not to overlap at least one line connecting the light-emission element part corresponding to the optical lens fixed to the substrate by each of the support parts, to another light-emission element part adjacent to the light-emission element part, in a part or a whole of a region in which the light-emission element parts are aligned and arranged two-dimensionally.

Furthermore, as a second characteristic, in addition to the first characteristic, the surface-emission unit according to the present invention is characterized in that each of the support parts is arranged so as not to overlap all lines connecting the light-emission element part corresponding to the optical lens fixed to the substrate by each of the support parts, to other light-emission element parts adjacent to the light-emission element part, in a part or a whole of a region in which the light-emission element parts are aligned and arranged two-dimensionally.

Furthermore, as a third characteristic, in addition to the first or second characteristic, the surface-emission unit according to the present invention is characterized in that each of the support parts is arranged so as not to overlap a region of a projection width of an emission part of the light-emission element part on the line which is not overlapped with the support part.

Furthermore, as a fourth characteristic, in addition to any of the first to third characteristics, the surface-emission unit according to the present invention is characterized in that the support part includes a bonding resin to fix the optical lens onto the substrate.

Furthermore, as a fifth characteristic, in addition to any of the first to fourth characteristics, the surface-emission unit according to the present invention is characterized in that the support part includes one or more poles of the optical lens projecting from a periphery part of the optical lens toward the substrate.

Furthermore, as a sixth characteristic, in addition to any of the first to fifth characteristics, the surface-emission unit according to the present invention is characterized in that the light-emission element part is composed of the light-emission element sealed with a transparent resin.

As a first characteristic, a method for producing the surface-emission unit according to the present invention is a method for producing the surface-emission unit according to any of the first to sixth characteristics, and characterized by comprising: preparing a light-emission element part including a light-emission element; preparing a substrate having a wiring and a land to mount the light-emission element part on the substrate; preparing an optical lens; aligning and arranging the light-emission element parts on the land of the substrate two-dimensionally; and fixing the optical lens on the substrate through one or more support parts with respect to each of the light-emission element parts, wherein each of the support parts is arranged so as not to overlap at least one line connecting the light-emission element part corresponding to the optical lens fixed onto the substrate by each of the support parts, to another light-emission element part adjacent to the light-emission element part, in a part or a whole of a region in which the light-emission element parts are aligned and arranged two-dimensionally, in the step of fixing the optical lens.

Furthermore, as a second characteristic, in addition to the first characteristic, the method for producing the surface-emission unit according to the present invention is characterized in that a bonding position of a bonding resin is arranged so as not to overlap at least one line connecting the light-emission element part corresponding to the optical lens bonded onto the substrate with the bonding resin, to another light-emission element part adjacent to the light-emission element part, in a part or a whole of a region in which the light-emission element parts are aligned and arranged two-dimensionally, in the step of fixing the optical lens.

Furthermore, as a third characteristic, in addition to the first or second characteristic, the method for producing the surface-emission unit according to the present invention is characterized in that the optical lens having one or more poles projecting from a periphery part toward the substrate direction is prepared, in the step of preparing the optical lens, and each of the one or more poles of the optical lens is arranged so as not to overlap at least one line connecting the light-emission element part corresponding to the optical lens fixed onto the substrate by each of the support parts, to another light-emission element part adjacent to the light-emission element part, in a part or a whole of a region in which the light-emission element parts are aligned and arranged two-dimensionally, in the step of fixing the optical lens.

Furthermore, as a fourth characteristic, in addition to any of the first to third characteristics, the method for producing the surface-emission unit according to the present invention is characterized in that each of the support parts is arranged so as not to overlap a region of a projection width of an emission part of the light-emission element part on the line which is not overlapped with each of the support parts.

According to the present invention, in the surface-emission unit which is composed of the light-emission element parts each having a light-emission element, aligned and arranged on a substrate two-dimensionally, and optical lenses each arranged on the substrate with respect to each light-emission element part, to diffuse light from the light-emission element, the support parts to fix the optical lens onto the substrate are arranged so as not overlap a line connecting the light-emission element part corresponding to the optical lens fixed by the support parts, to another light-emission element part adjacent to the light-emission element part. Thus, since the shadows generated when the support parts shield the light from the light-emission element do not overlap with each other, linear irregularity in brightness can be prevented from being generated in the region in which the support parts are arranged so as not to overlap the line.

DETAILED DESCRIPTION OF THE INVENTION

First Embodiment

Figure 1:
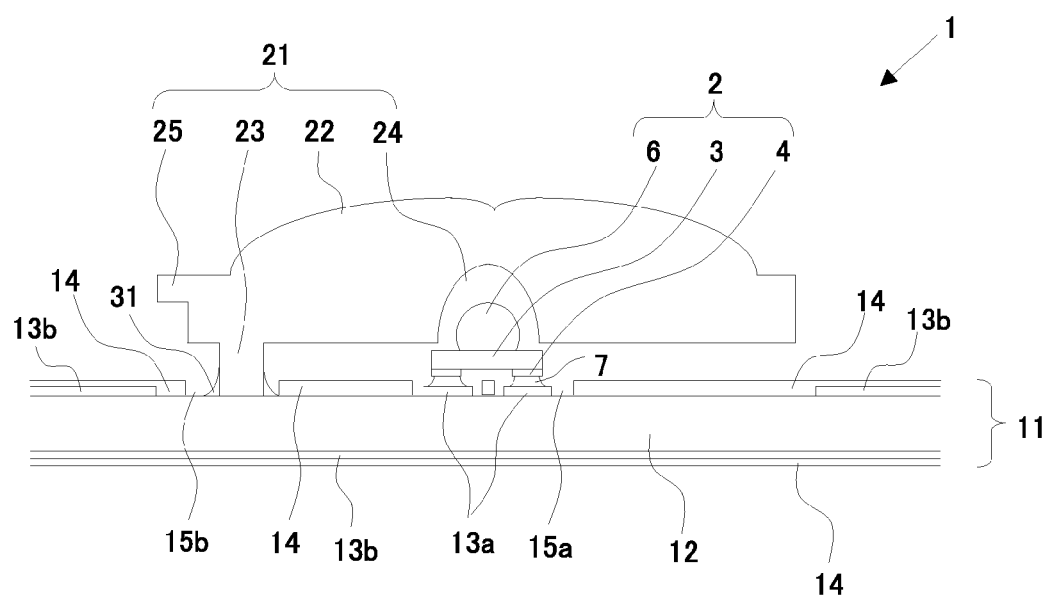
FIG. 1 is a cross-sectional view of a light-emission element module used in a surface-emission unit according to the present invention.

FIG. 1 shows a configuration example of a light-emission element module 1 used in a surface-emission unit in the present invention, on which a light-emission element is mounted. FIG. 1 is a cross-sectional view taken in a direction perpendicular to a substrate of the light-emission element module 1 to which this embodiment is applied. While a plurality of light-emission element parts 2 each having an LED as a light-emission element are arranged in one or more columns, on a substrate 11, FIG. 1 shows one focused light-emission element part 2. In addition, in the following drawings, an essential part is emphasized occasionally, and a dimension ratio of each component on the drawings does not always coincide with a real dimension ratio thereof.

The light-emission element part 2 is configured in such a manner that one or more LED chips (not shown) are mounted on a component substrate 3 made of ceramics or the like, and electrically connected to the component substrate 3 by a wire (not shown) or the like, and the LED chip and the wire are sealed by a sealing resin 6. Thus, the light-emission element part 2 is connected to the substrate 11 through a component terminal 4 with a conductive material 7 such as solder on a land part 13a of the substrate 11, and it is arranged in such a manner that the center of an optical lens 21 roughly coincides with the center of the light-emission element part 2. A transparent resin such as silicone is used as the sealing resin 6, and a fluorescent material may be added as needed. Thus, the light-emission element part 2 in which the LED chip is previously sealed with the transparent resin is produced, and the non-defective light-emission element part 2 is mounted on the substrate 11, whereby a yield of the light-emission element module 1 having many LEDs is prevented from being lowered.

The substrate 11 is produced, for example by installing wiring on a base material 12 formed by impregnating a woven or unwoven glass fiber or an organic fiber with a resin (such as an epoxy resin or cyanate resin). A wiring 13 (13a and 13b) is made of copper. A top surface of the wiring may be gold-plated. In addition, since heat generation amount of the light-emission element part 2 is relatively large, the wiring is preferably provided on both surfaces of the substrate 11. The land part 13a is arranged in a position on which the light-emission element part 2 is mounted, so as to align with a position of the component terminal 4. A white insulation material (such as a white resist) 14 is formed on the top surface of the substrate so as to cover an arrangement region of an electrode of the wiring part 13b except for the land part 13a. As the top surface of the substrate 11 is covered with the white insulation material 14, the wiring can be protected, light reflectance from the light-emission element is enhanced, and a light irradiation amount to a display area can be improved. In addition, in a case where a reflection sheet is provided on the substrate surface separately, a normal solder resist may be used.

The substrate 11 has opening parts 15a and 15b which are not covered with the insulation material 14, and in the opening part 15a, the light-emission element part 2 is connected to the land part 13a on the substrate 11, and in the opening part 15b, the optical lens 21 and the base material 12 on the substrate 11 are fixed by a bonding resin 31. In this case, a bonding resin having a high rate of elongation is preferably used as the bonding resin 31, and more specifically, a bonding resin having a tensile breaking elongation of 50% or more is preferably used. Thus, a stress generated due to mismatch in thermal expansion coefficient between the substrate 11 and the optical lens 21 is absorbed in the bonding part between the substrate and the optical lens, and the bonding part between the substrate and the optical lens is prevented from being cracked or flaked, so that the light-emission element module having a high yield can be provided. For example, an epoxy-based heat-curable resin, or silicone-based, acrylic-modified silicone-based, or urethane-based moisture-curable resin may be used.

A size of the opening part 15b is preferably set to be the same as a bottom surface size of a pole part 23 of the optical lens 21 or slightly larger than it. Thus, by providing the opening part whose size is the same as the bottom surface size of the pole part 23 or slightly larger than it, in the insulation material, the bonding resin 31 can be easily positioned, and the resin amount can be easily managed. When the amount of the bonding resin 31 is too much, the bonding resin 31 reaches the bottom surface of a lens part 22 of the optical lens, or spreads beyond the opening part 15b on the substrate 11, which could cause a transmitted light to be shielded or absorbed in the bottom surface of the lens part 22 or in the pole part 23, and affect diffusion of the light from the light-emission element. In addition, the thermal expansion coefficient of the substrate 11 is in a range from $1\times10^{-5}/°$ C. to $3\times10^{-5}/°$ C. in the case of the resin substrate 11, and $5\times10^{-6}$/M in a case of a ceramic substrate. In addition, the opening part 15b is arranged so as not to overlap a line connecting the adjacent light-emission element parts 2. Thus, the pole part 23 of the optical lens and the bonding resin 31 are arranged so as not to overlap the line connecting the adjacent light-emission element parts 2, and shadows generated when the pole parts 23 of the optical lenses and the bonding resins 31 shield the lights from the light-emission elements do not overlap with each other, so that linear irregularity in brightness can be prevented from being generated.

Figure 2A:
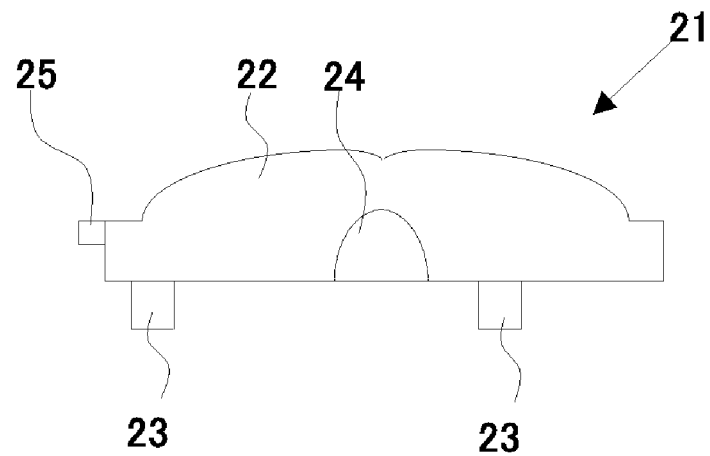
FIGS. 2A and 2B are views showing a shape of an optical lens set in the light-emission element module.
Figure 2B:
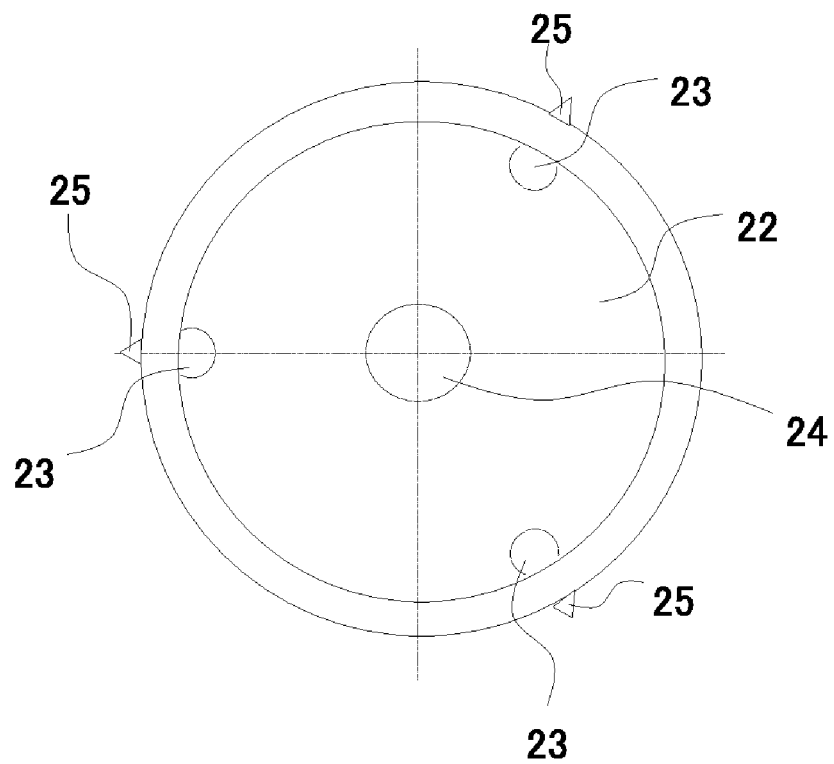

The optical lens 21 may be made of acrylic-based resin, polycarbonate or methacrylate which is superior in transparency, in addition to styrene-based or epoxy-based resin. A thermal expansion coefficient of these materials is in a range from $6\times10^{-5}/°$ C. to $8\times10^{-5}/°$ C. FIG. 2 shows a shape of the optical lens 21. FIG. 2A shows a side view thereof, and FIG. 2B shows a top view thereof. As shown in FIGS. 2A and 2B, the optical lens 21 has the lens part 22, the pole part 23, a dent part 24, and a mark part 25, and they are integrally molded and produced as one body by injection molding with a die.

The lens part 22 is designed and formed in an aspheric shape so as to be able to diffuse the light, based on previous simulation.

The pole part 23 is composed of one or more poles provided to fix the optical lens 21 to the substrate 11 with the bonding resin 31. It is desirable that the three or more poles are provided so that the optical lens 21 can be easily mounted horizontally with respect to the substrate 11. In addition, all poles of the pole part 23 may be fixed to the substrate 11 with the bonding resin 31, but it is preferable that at least two poles are fixed because the rotation of the optical lens 21 is prevented. The poles of the pole part 23 and the bonding resin 31 function as a support part to fix the optical lens 21 to the substrate.

Furthermore, the pole part 23 has a role to diffuse the stress applied to the bonding part due to the mismatch in thermal expansion coefficient between the substrate 11 and the optical lens 21. The stress is generated when a dimension (distance between the poles of the pole part 23) is changed due to the temperature change (caused because the light-emission element part 2 and other components are repeatedly heated and cooled due to cooling after the heat treatment of the bonding resin 31, or ON/OFF of a display device) after the optical lens 21 has been bonded to the substrate 11. Therefore, as the height of the pole of the pole part 23 increases, the stress to the bonding part can be highly diffused.

Furthermore, since the substrate 11 and the optical lens 21 are bonded through the pole part 23, a layer corresponding to the height of the pole in which air can be moved is provided between the substrate 11 and the optical lens 21, so that a radiation property of the light-emission element module 1 can be improved.

In addition, while the cross-section of the pole part 23 taken in a direction horizontal to the upper surface of the substrate 11 may be in various shapes such as a circle, ellipse, triangle, square, rectangle, or polygon, a width of the cross section thereof in a direction connecting the center of the optical lens 21 and the center of the pole part 23 (that is, a radial direction of the lens) is preferably about 0.5 to 5 mm. This is because when the width of the pole part 23 is too large in the direction connecting the center of the optical lens 21 to the center of the pole part 23, an optical impact is generated, and the optical impact prevents the light directly emitted from the light-emission element part 2 or the light reflected from the surface of the substrate 11 from entering the optical lens 2, while when it is too narrow, the intensity is lowered. Meanwhile, in a direction perpendicular to a line connecting the center of the optical lens 21 and the center of the pole part 23 (that is, circumferential direction of the lens), its width can be relatively set to be large, and the width of the cross-section is preferably about 0.5 to 10 mm. While the above described optical impact is small in the direction perpendicular to the line connecting the center of the optical lens 21 and the center of the pole part 23, however, when the cross-sectional width of the pole part is too large, radiation property is affected because air movement is prevented. However, even when the cross-sectional width exceeds 10 mm, the radiation property is improved as compared with a case where the light-emission element part 2 is sealed because the layer in which air can be moved is provided.

Although the height of the pole part 23 is desirably as high as possible with a view to reducing the stress applied to the bonding resin 31, it is determined based on a thickness of the display device on which the light-emission element module 1 is mounted, and a mounted height of the light-emission element, and it may be 0.1 to 5 mm. In addition, the longer a distance between the poles of the pole part 23 fixed with the bonding resin 31, the higher the stress applied to the bonding resin 31, so that the distance between the poles is preferably 20 mm or less.

The dent part 24 to partially house the light-emission element part 2 is formed in the center of the optical lens 21, the light-emission element part 2 is not sealed, and the layer of air is provided between the light-emission element part 2 and the dent part 24, so that the radiation property is improved in the light-emission element part 2, and eventually in the light-emission element module 1 as a whole.

The mark part 25 is used as an alignment mark when the optical lens 21 is mounted on the substrate 11. The mark part 25 projects outward from a periphery of the optical lens 21, and is provided, outside of the pole part 23, on a line extending from the center of the optical lens 21 through the center of each of the three poles. The mark part 25 is in the shape of a triangle or rectangle as seen from a front side of the optical lens 21, and only has to be in the shape which can be distinguished from a shape of a gate cut part (not shown) after the optical lens has been molded. According to this embodiment, since the shape of the gate cut part is a rectangle, the shape of the mark part 25 is a triangle.

Second Embodiment

Figure 3:
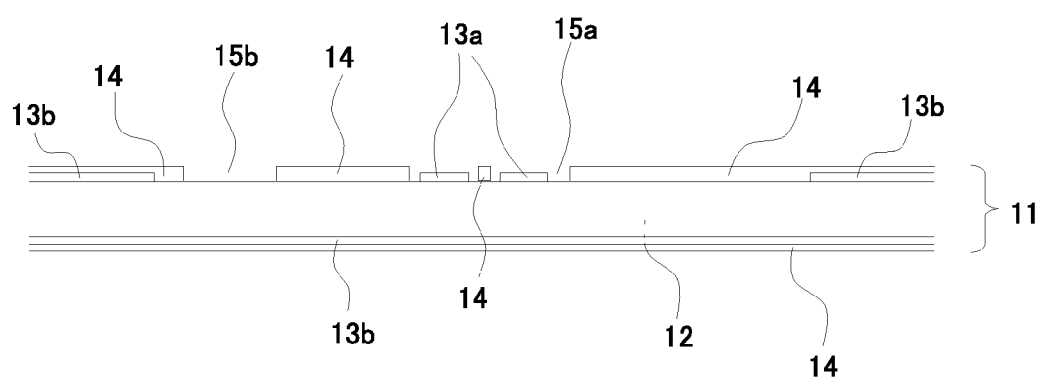
FIG. 3 is a view showing production steps of the light-emission element module.
Figure 4:
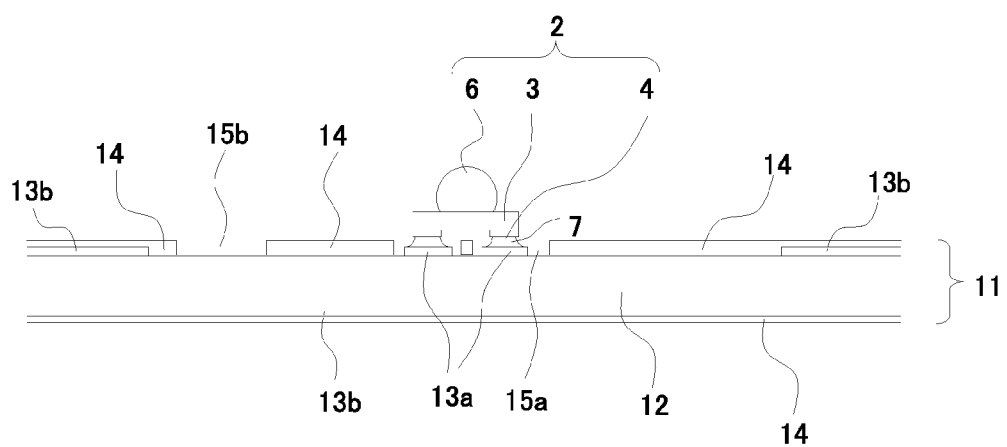
FIG. 4 is a view showing production steps of the light-emission element module.

Next, a description will be made of a method for producing the light-emission element module 1. FIGS. 3 and 4 are views showing steps for producing the light-emission element module 1 shown in FIG. 1.

First, the light-emission element part 2, the substrate 11, and the optical lens 21 are prepared. Here, the substrate 11 is a resin substrate in which an epoxy resin and glass fiber are mixed, for example and FIG. 3 is a cross-sectional view of the substrate 11. The wiring 13 is formed on both surfaces of the substrate 11. The wiring 13 may be made of a material such as copper, nickel, or gold. The wiring 13 is composed of the land part 13a formed on one surface of the substrate 11 to mount the light-emission element part 2, and the wiring part 13b formed on both surfaces of the substrate 11. In addition, by providing the wiring part 13b on the whole other surface on which the light-emission element part 2 is not mounted, the radiation property of the substrate 11 is improved. The solder resist 14 covers the whole surface of the wiring part 13b formed on both surfaces, to protect the wiring part 13b, and the opening parts 15a and 15b are provided in a position for the land part 13a, and the position in which the pole part 23 of the optical lens 21 is set, respectively.

The light-emission element part 2 is formed in such a manner that the one or more LED chips (not shown) are mounted on the ceramic component substrate 3 so as to be electrically connected by a wire (not shown), and the LED chips and the wire are sealed with the sealing resin 6. The sealing resin 6 is preferably a silicone-based resin which is superior in heat resistance and light resistance.

As for the optical lens 21, the lens part 22, the pole part 23, the dent part 24, and the mark part 25 are integrally molded by injection molding with a die. While the pole part 23 and the mark part 25 may be mounted in later process, the integral molding which is easy in view of process is preferable because it requires only one kind of material.

Then, the light-emission element part 2 is mounted on the substrate 11. FIG. 4 is a cross-sectional view of the substrate 11 on which the light-emission element part 2 is mounted. The mounting surface of the component substrate 3 of the light-emission element part 2 is provided with the component terminal 4 made of a material such as copper, silver, nickel, or gold, and mounted on the land part 13a of the substrate 11 by the conductive material 7 such as solder or a conductive bonding material. The conductive material 7 may be provided on one or both of the component terminal 4 and the land part 13a. The conductive material is subjected to a heat treatment in a reflow furnace or oven, so that the light-emission element part 2 is fixed onto the substrate 11.

Then, the optical lens 21 is fixed onto the substrate 11 with the bonding resin 31. As described above, the bonding resin 31 is the bonding resin having the high rate of elongation. At this time, the pole part 23 of the optical lens 21 and the bonding resin 31 are arranged so as not to overlap the line connecting the adjacent light-emission element parts 2. Thus, shadows generated when the pole parts 23 of the optical lenses and the bonding resins 31 shield the lights from the light-emission elements do not overlap with each other, so that the linear irregularity in brightness can be prevented from being generated.

An appropriate amount of the bonding resin 31 is supplied onto the opening part 15b on the substrate 11 shown in FIG. 4 to bond the bottom surface of the pole of the pole part 23 of the optical lens 21. When the bonding resin 31 is liquid, the bonding resin 31 is supplied to the optical lens bonding position on the substrate 11 by a dispense method or printing method. When the bonding resin 31 is in the shape of a sheet or tape, it is supplied by tentative pressing. In view of the production, it is easy and simple that the liquid bonding resin 31 is applied by the dispense method.

Since the bonding resin 31 is supplied to only the bonding position (the bottom parts of all poles of the pole part 23 or at least one of them), its amount can be reduced as compared with a case where a whole lens periphery is bonded like the conventional technique.

Then, the optical lens 21 is fixed to the substrate 11 by use of a general mounting machine such as a die bonder or mounter. The mark part 25 is used as the alignment mark at this time.

When an epoxy-based heat-curable type bonding resin is used as the bonding resin 31, it can be cured by a heat treatment at 80° C. lower than 90° C. for 5 minutes after the lens 21 has been mounted. Therefore, as compared with a general bonding resin which is cured at a high temperature of 150° C. or more, the stress applied after cooling performed after the thermal curing can be small. In addition, since the treatment is performed in a short time such as 5 minutes, the resin can be cured by a hot plate or reflow furnace as well as the oven.

In addition, when a moisture-curable type bonding resin such as silicone-based resin, or polyurethane is used as the bonding resin 31, it can be cured at a lower temperature such as 40 to 60° C. Furthermore, when the curing treatment for a long time such as 8 hours can be allowed, the stress applied to the bonding resin 31 can be further reduced because it can be cured at room temperature.

Through the above steps, the optical lens 21 is bonded onto the substrate 11 through its support part 23, and fixed onto the substrate 11 in such a manner that the center of the optical lens 21 roughly coincides with the center of the light-emission element part 2, whereby the light-emission element module 1 in which the light-emission element part 2 and the optical lens 21 are set on the substrate 11 is produced as shown in FIG. 1.

Third Embodiment

When the light-emission element module 1 can be used as a surface-emission unit used as a backlight of a liquid crystal television or a liquid crystal monitor, or a lighting equipment, by itself or combining a plurality of the same kind or different kind of light-emission element modules and connecting them in vertical and horizontal directions. In this surface-emission unit, a light emission region corresponding to a screen size can be ensured by arranging the light-emission element parts each having the light-emission element two-dimensionally in the shape of a matrix.

FIGS. 5 to 12 show configuration examples of the surface-emission unit, which show arrangement relationships among the light-emission element part 2, the optical lens 21, and the respective poles of the pole part 23 of the optical lens and the bonding resin 31. A description will be made of linear irregularity in brightness generated when the light-emission element is turned on, with reference to FIGS. 5 to 12.

Figure 10:
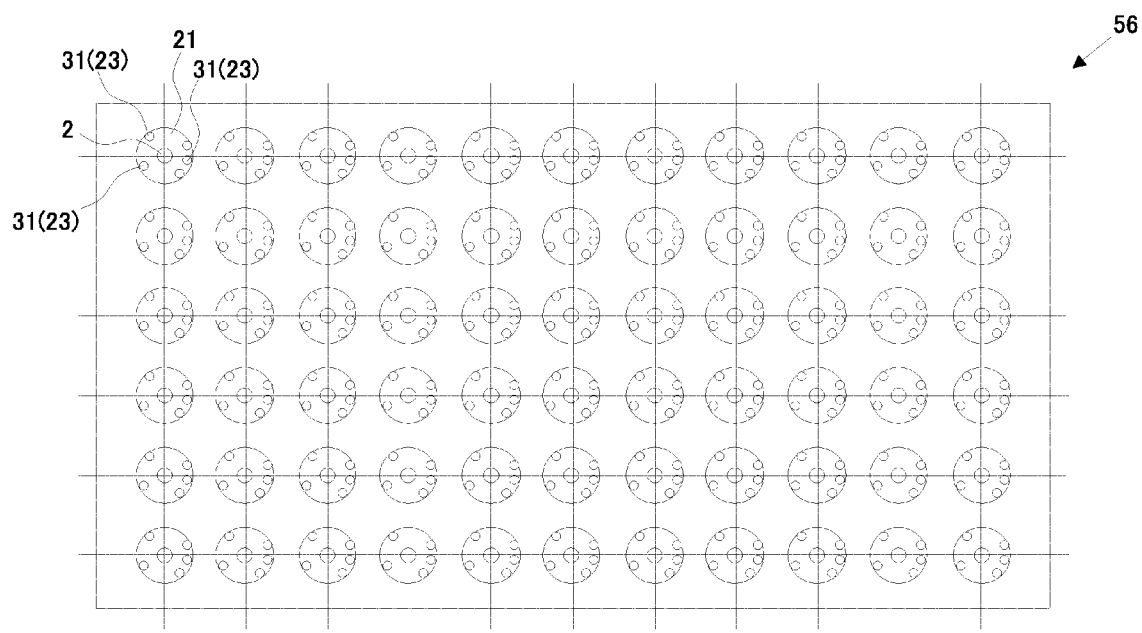
FIG. 10 is a view showing arrangements of a light-emission element part, an optical lens, and a support part of a surface-emission unit according to the present invention.
Figure 11:
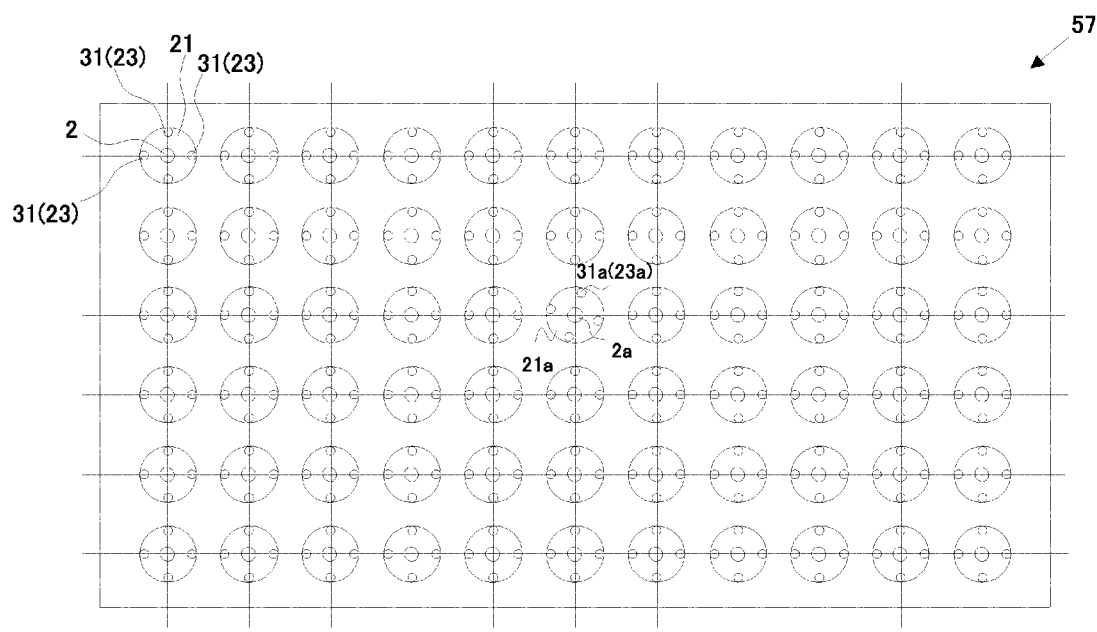
FIG. 11 is a view showing arrangements of a light-emission element part, an optical lens, and a support part of a surface-emission unit according to the present invention.
Figure 12:
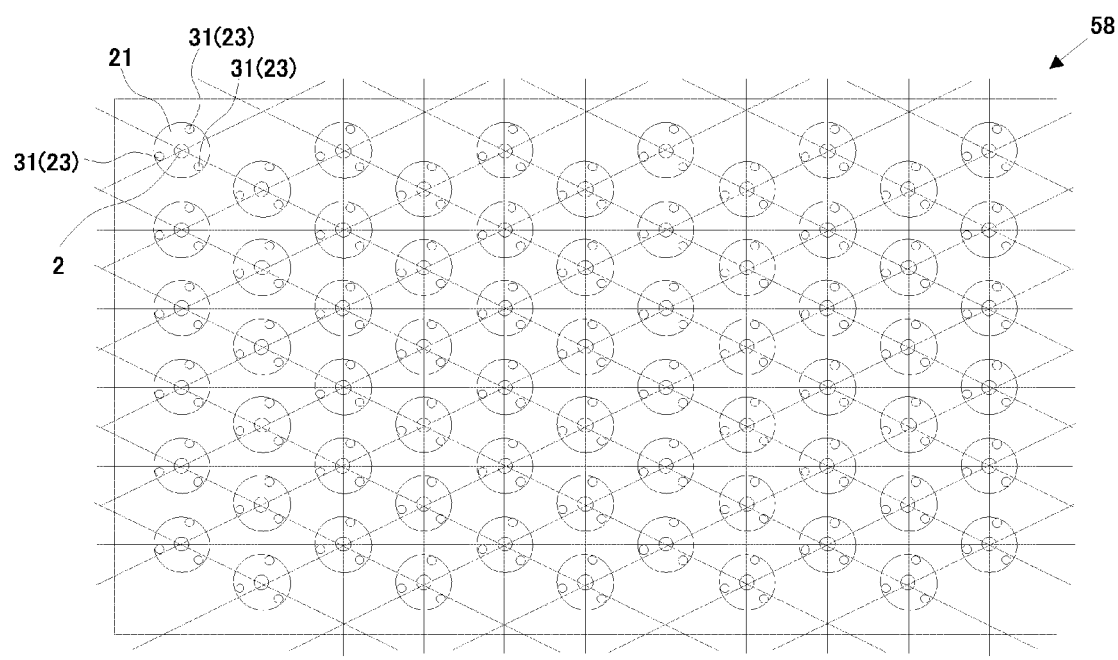
FIG. 12 is a view showing arrangements of a light-emission element part, an optical lens, and a support part of a surface-emission unit according to the present invention.
Figure 13A:
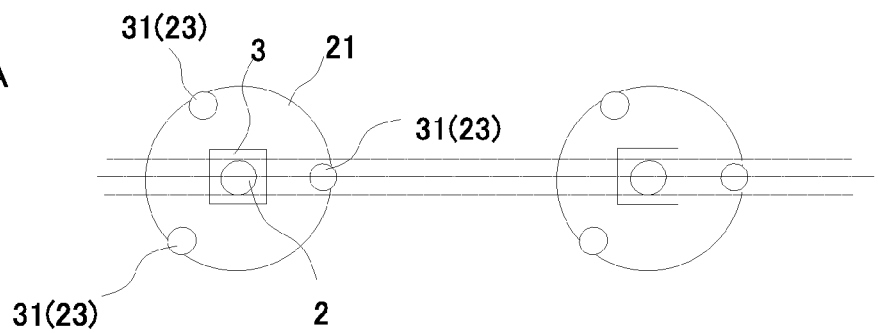
FIGS. 13A to 13D are views showing detailed arrangements of a light-emission element part, an optical lens, and a support part of a surface-emission unit according to the present invention.
Figure 13B:
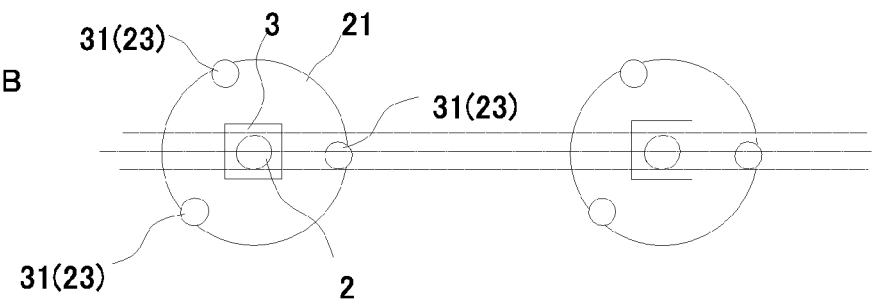
Figure 13C:
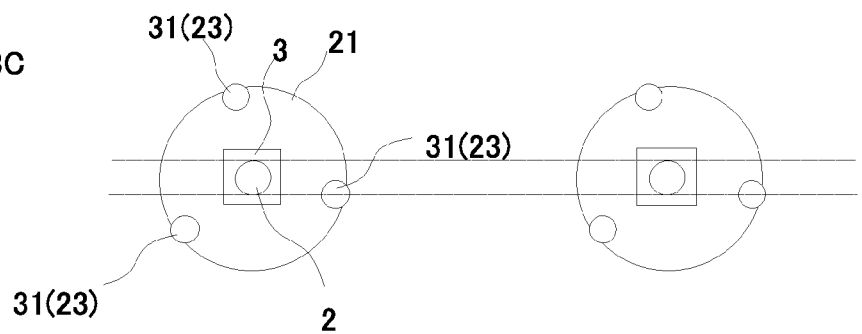
Figure 13D:
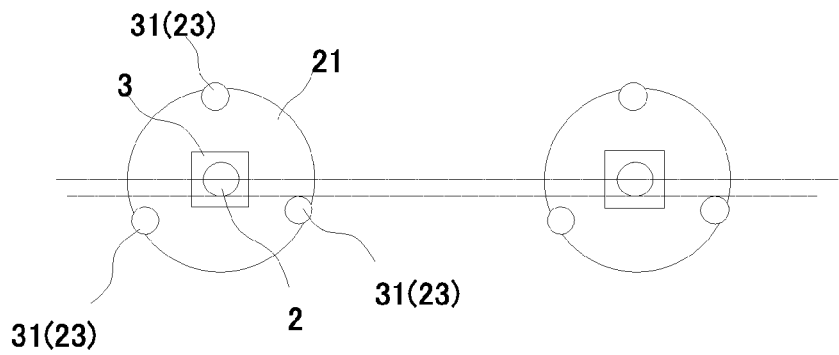

In FIGS. 5 to 12, a region surrounded by a dot line is a region serving as a screen of the liquid crystal television or the liquid crystal monitor, or a light emission surface of the surface emission type lighting equipment. In this region, the light-emission element parts 2 and the optical lenses 21 are arranged two-dimensionally in the shape of the matrix in one or more light-emission element modules. The way of arrangement includes a grid arrangement as shown in FIGS. 5 to 11, a staggered arrangement between odd columns and even columns as shown in FIG. 12, and a radial arrangement (not shown). In any arrangement, there are lines (dashed lines) connecting the adjacent light-emission element parts in a vertical, horizontal or oblique direction.

Figure 5:
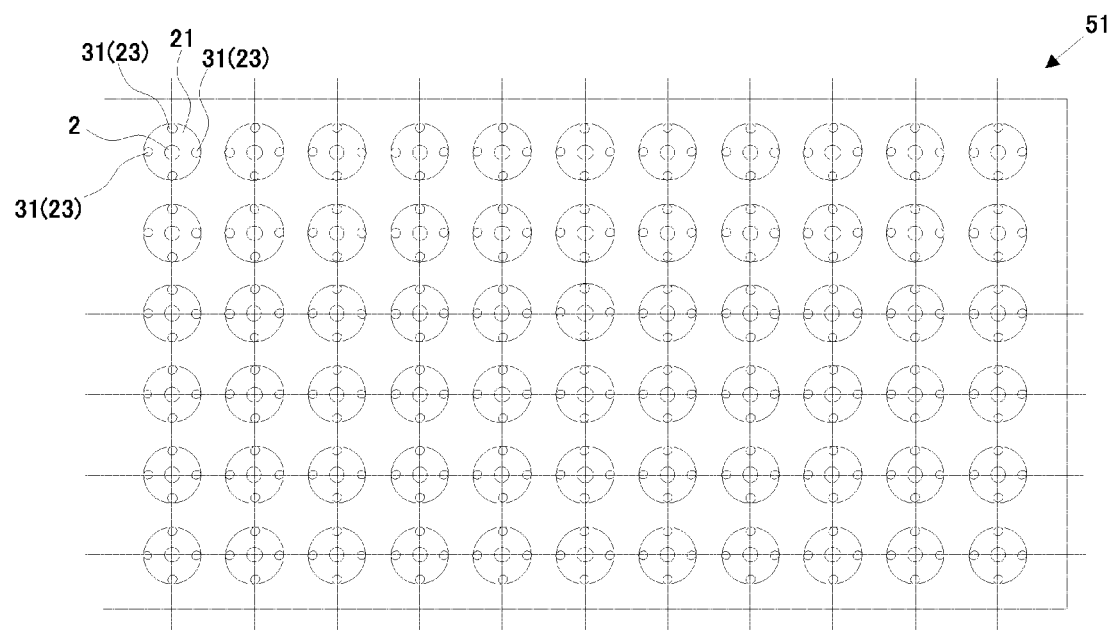
FIG. 5 is a view showing arrangements of a light-emission element part, an optical lens, and a support part of a surface-emission unit in which linear irregularity in brightness is generated in a vertical direction and in a horizontal direction.

The surface-emission unit 51 shown in FIG. 5 has four support parts (the bonding resins 31 or the poles of the pole part 23, or both of them) with respect to each optical lens 21, and the center of the support part is arranged so as to overlap vertical and horizontal lines connecting the centers of the adjacent light-emission element parts 2. In this case, linear irregularity in brightness is generated in the vertical and horizontal directions. This is caused because shadows are generated when the support parts shield the light from the light-emission element part 2, and the shadows are aligned on the line connecting the light-emission element parts 2, overlap with each other, and are emphasized.

Figure 6:
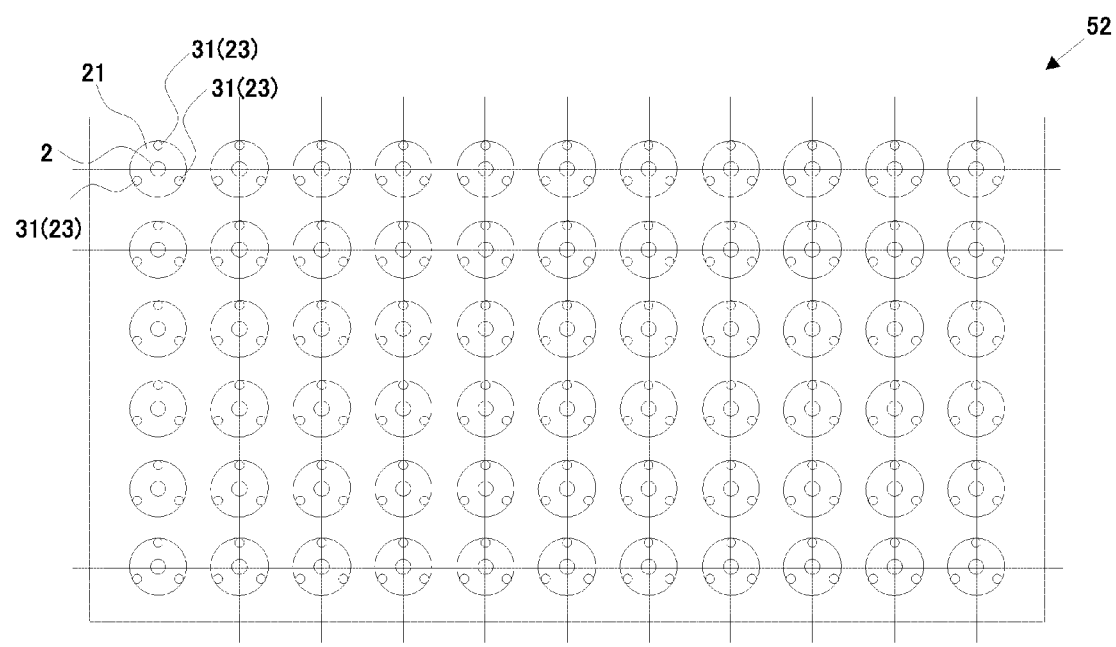
FIG. 6 is a view showing arrangements of a light-emission element part, an optical lens, and a support part of a surface-emission unit according to the present invention.

A surface-emission unit 52 shown in FIG. 6 has three support parts (the bonding resins 31 or the poles of the pole part 23, or both of them) with respect to each optical lens 21, and the three support parts of the optical lens 21 are arranged in such a manner that the center of one of the support parts is arranged so as to overlap a vertical line connecting the centers of the adjacent light-emission element parts 2, while the horizontal line connecting the centers of the adjacent light-emission element parts 2 is not overlapped. In this case, the linear irregularity in brightness is generated in the vertical direction, but it is not generated in the horizontal direction. This is because the support parts shield the light from the light-emission element part 2, and the shadows are generated, and the shadows are aligned on the line connecting the vertically adjacent light-emission element parts 2 and emphasized, but they are not aligned on the line connecting the horizontally adjacent light-emission element parts 2.

Figure 7:
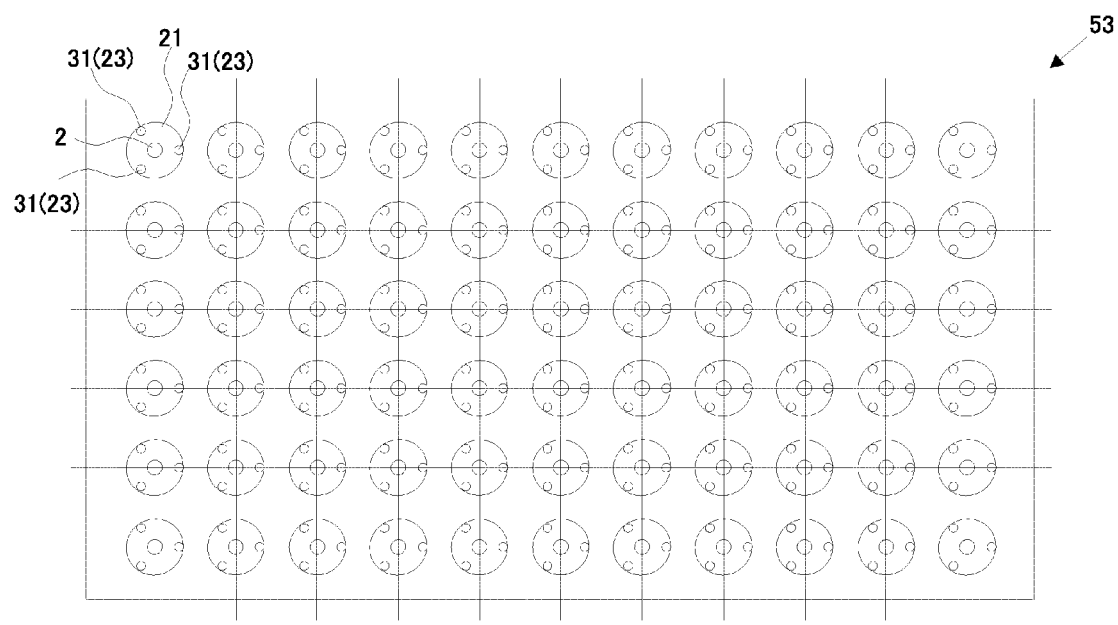
FIG. 7 is a view showing arrangements of a light-emission element part, an optical lens, and a support part of a surface-emission unit according to the present invention.

A surface-emission unit 53 shown in FIG. 7 has three support parts (the bonding resins 31 or the poles of the pole part 23, or both of them) with respect to each optical lens 21, and the three support parts of the optical lens 21 are arranged in such a manner that the center of one of the support parts is arranged so as to overlap a horizontal line connecting the centers of the adjacent light-emission element parts 2, while the vertical line connecting the centers of the adjacent light-emission element parts 2 is not overlapped. In this case, the linear irregularity in brightness is generated in the horizontal direction, but it is not generated in the vertical direction. This is because the support parts shield the light from the light-emission element part 2, and shadows are generated, and the shadows are aligned on the line connecting the horizontally adjacent light-emission element parts 2 and emphasized, but they are not aligned on the line connecting the vertically adjacent light-emission element parts 2.

Figure 8:
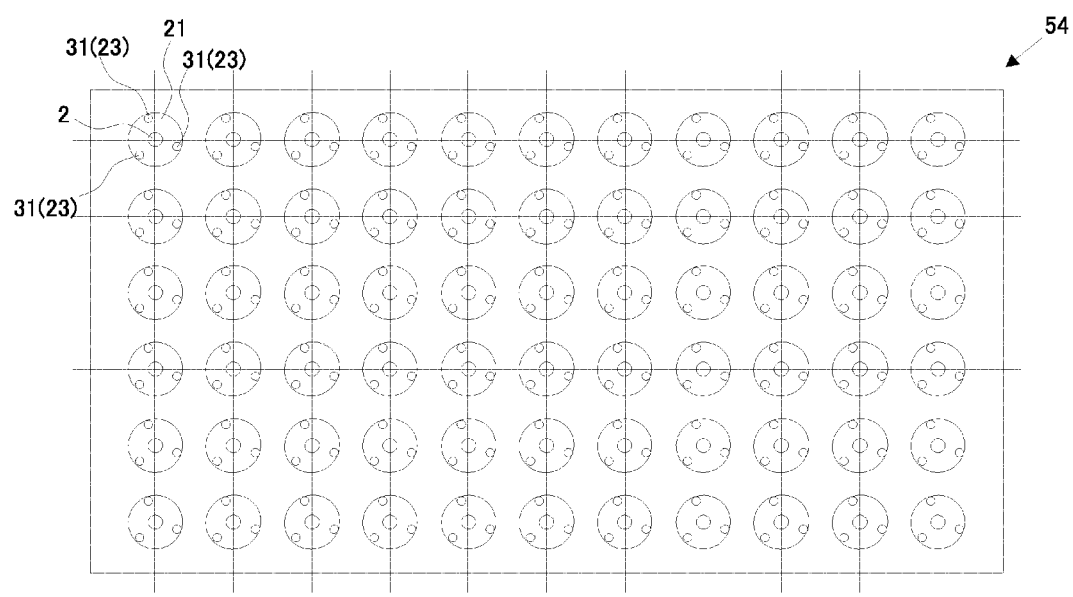
FIG. 8 is a view showing arrangements of a light-emission element part, an optical lens, and a support part of a surface-emission unit according to the present invention.
Figure 9:
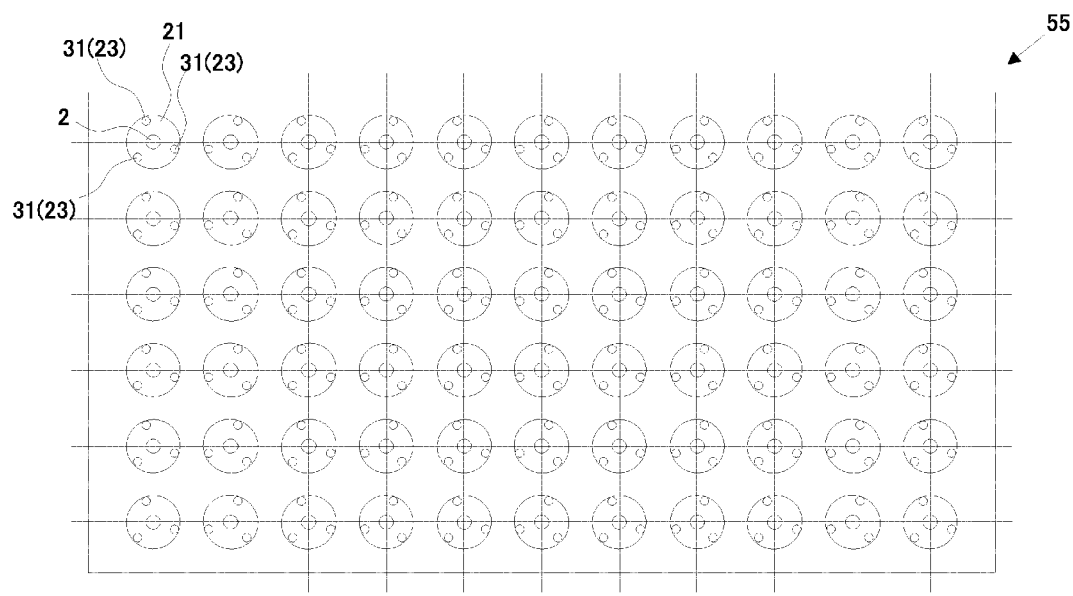
FIG. 9 is a view showing arrangements of a light-emission element part, an optical lens, and a support part of a surface-emission unit according to the present invention.

In surface-emission units 54 to 56 shown in FIGS. 8 to 10, centers of the support parts (the bonding resins 31 or the poles of the pole parts 23, or both of them) of the optical lenses 21 are all arranged so as not to overlap vertical and horizontal lines connecting the centers of the adjacent light-emission element parts 2. In this case, the liner irregularity in brightness is not generated in the vertical direction nor horizontal direction. This is because although the support parts shield the light from the light-emission element part 2 and shadows are generated, the shadows are not aligned on the vertical and horizontal lines connecting the adjacent light-emission element parts 2. While the arrangements of the support parts for all optical lenses 21 are the same in the surface-emission unit 54 shown in FIG. 8, the arrangements are different between odd columns and even columns in the surface-emission unit 55 shown in FIG. 9. Even in the case of random arrangement, since the overlapping shadows of the support parts are reduced, the linear irregularity in brightness can be suppressed.

While the three support parts are provided with respect to each optical lens 21 in the surface-emission units 54 and 55 shown in FIGS. 8 and 9, the five support parts are provided with respect to each optical lens 21 in the surface-emission unit 56 shown in FIG. 10. However, since the five support parts are all arranged so as not to overlap the vertical and horizontal lines connecting the centers of the adjacent light-emission element parts 2 in the surface-emission unit 56, the linear irregularity in brightness is not generated in the vertical direction nor in the horizontal direction.

In a surface-emission unit 57 shown in FIG. 11, centers of support parts are arranged so as to overlap vertical and horizontal lines connecting centers of adjacent light-emission element parts 2a except for one optical lens 21a. This means in the one optical lens 21a, centers of its support parts (bonding resins 31a or poles of a pole part 23a, or both of them) are arranged so as not to overlap lines connecting the centers of the corresponding light-emission element part 2a and the light-emission element part adjacent to the light-emission element part 2a, so that the irregularity in brightness can be slightly suppressed in the vicinity of the optical lens 21a as compared with the surface-emission unit shown in FIG. 5.

In a surface-emission unit 58 shown in FIG. 12, the light-emission element parts 2 are staggered between the odd columns and the even columns, and the light-emission element parts 2 are adjacent to each other in a vertical direction and an oblique direction. In this case, the vertical and oblique directions are likely to be affected by shadows as compared with the horizontal direction. Therefore, as shown in FIG. 12, when the centers of the support parts (the bonding resins 31 or the poles of the pole parts 23, or both of them) of the optical lens 21 are arranged so as not to overlap lines connecting the adjacent light-emission element parts 2 in the vertical direction and oblique direction, the linear irregularity in brightness is not generated, so that a preferable result has been obtained.

Therefore, by arranging the support part for fixing the optical lens 21 to the substrate 11 so as not to overlap the lines connecting the light-emission element part corresponding to the optical lens fixed by the above support part, to another light-emission element part adjacent to the light-emission element part, the linear irregularity in brightness is suppressed in the surface-emission unit.

FIG. 13 shows a positional relationship among the support part to fix the optical lens 21 to the substrate 11, the light-emission element part corresponding to the optical lens fixed by the support part, and the light-emission element part adjacent to that light-emission element part. In FIG. 13A, the center of the support part is arranged on the line connecting the centers of the adjacent light-emission element parts 2, and in this case, contrast of a shadow of the support part highly appears. In FIG. 13B, the center of the support part is arranged so as not to overlap the line connecting the centers of the adjacent light-emission element parts 2, so that the contrast of the shadow of the support part is lowered and the irregularity in brightness is not likely to be recognizable. In FIG. 13C, the whole support part is arranged so as not to overlap the line connecting the centers of the adjacent light-emission element parts 2, so that the contrast of the shadow of the support part is further lowered, and the irregularity in brightness is hardly recognizable. In FIG. 13D, the whole support part is arranged so as not to overlap a range of a projection width connecting emission parts (a part to emit the light, and corresponding to the range of the sealing resin 6 of the light-emission element in this embodiment) of the adjacent light-emission element parts 2, and this is the most desirable arrangement.

In addition, the above embodiments are just one example of the preferred embodiments of the present invention. The embodiment of the present invention is not limited to the above, and various kinds of modifications and variations may be made without departing from the scope of the present invention.

Other Embodiments

Hereinafter, other embodiments will be described.

(1) While the support part to fix the optical lens to the substrate is composed of the poles of the pole part 23 of the optical lens 21, and the bonding resin 31 to bond the bottom surface of the poles to the substrate 11 in the above embodiments, the present invention is not necessarily limited to the above. For example, a separately molded transparent pole part may be inserted and fixed onto the substrate 11 and then, an upper surface of this pole part may be bonded to the optical lens 21 by a bonding resin. In this case also, by arranging the pole part so as not to overlap the line connecting the adjacent light-emission element parts 2, the shadows generated when the pole parts and the bonding resins 31 shield the lights from the light-emission elements do not overlap with each other, so that the linear irregularity in brightness is prevented from being generated. In addition, the optical lens may be fixed only by the bonding resin. In this case also, by arranging the bonding part so as not to overlap the line connecting the adjacent light-emission element parts 2, the shadows generated when the pole parts and the bonding resins shield the lights from the light-emission elements do not overlap with each other, so that the linear irregularity in brightness is prevented from being generated.

(2) In addition, in the above embodiments, regarding the arrangement relationships among the light-emission element part 2, the optical lens 21, and the respective poles of the pole part 23 of the optical lens (the bonding resin 31) within the surface-emission unit, FIGS. 6 to 9 and FIG. 12 show the case where the number of the poles of the pole part 23 provided with respect to each optical lens 21 is three, FIG. 11 shows the case where it is four, and FIG. 10 shows the case where it is five. However, these are examples, and the present invention is not limited by the number of the poles of the pole part 23. Even when the optical lens 21 has only one pole, the optical lens 21 can be fixed to the substrate 11 through the one pole.

Furthermore, by arranging the respective poles of the optical lenses 21 so as not to overlap the line connecting the adjacent light-emission element parts 2, the shadows generated when the poles shield the lights from the light-emission elements do not overlap with each other, so that the linear irregularity in brightness is prevented from being generated.

Figure 14:
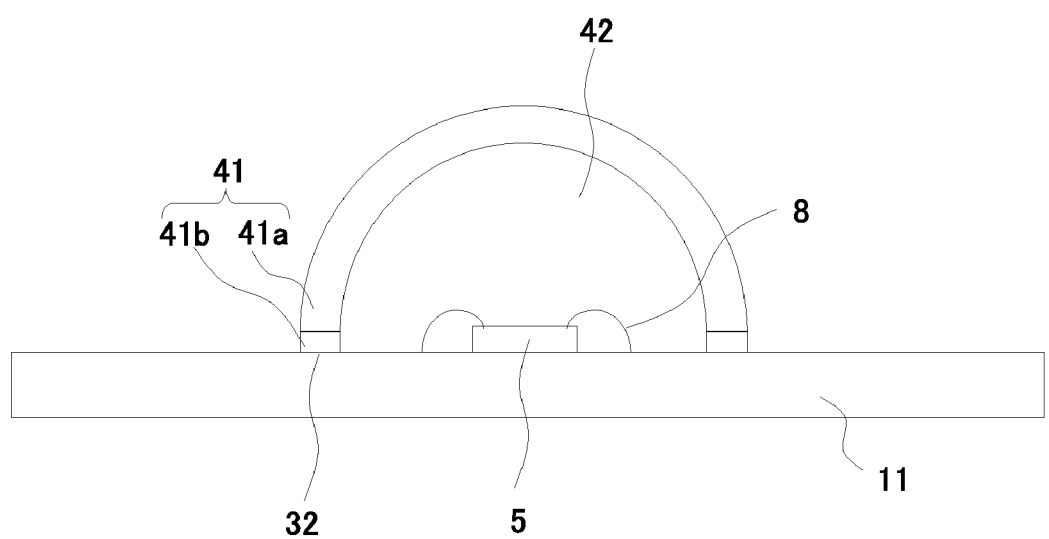
FIG. 14 is a cross-sectional view of a light-emission element module according to a conventional technique.

Alternatively, in FIG. 14 related to the above conventional art, the bonding resin 32 corresponds to the pole part 23 of the present invention. In this case, the cap 41 is bonded and fixed to the substrate through the bonding resin 32 by applying the bonding resin 32 not to the whole bottom surface of the cap 41 but to one or more regions of a part of the bottom surface of the cap 41 in the shape of a dot so that the regions on the substrate 11 at which the cap 41 is fixed do not overlap the line connecting the adjacent LEDs 5, and thus the effect of the present invention can be gained.

(3) In addition, while the surface-emission unit is configured by aligning and arranging the light-emission element parts 2 each having the light-emission element sealed with the transparent resin, on the substrate 11 two-dimensionally in the above embodiments, as another example, the light-emission elements such as the LEDs may be aligned and arranged directly on the substrate 11 two-dimensionally, and sealed with the resin on the substrate 11. In this case, the light-emission element part 2 is composed of each of the light-emission elements aligned and arranged on the substrate 11 two-dimensionally and sealed with the resin.

(4) While the optical lens 21 is fixed onto the substrate 11 in such a manner that the base material 12 of the substrate 11 and the pole part 23 of the optical lens 21 are bonded by the bonding resin 31 in the opening part 15b formed in the insulation material (solder resist) 14 in the first and second embodiments, the insulation material (solder resist) 14 and the pole part 23 of the optical lens 21 may be fixed with the bonding resin 31 without providing the opening part 15b. In this case, by marking the region in which the pole part 23 is arranged, the positioning of the bonding position and the management of the resin supply amount can be easily made when the bonding resin 31 is supplied. However, since adhesion between the insulation material 14 and the base material 12 is not preferable in some cases, in this case, the opening is preferably provided in the insulation material 14.

(5) As for the light-emission element module 1, the require number of light-emission element parts 2 which correspond to the whole display screen may be all mounted on one module, but in this case, the substrate 11 having a size corresponding to a display screen size is needed, and it is necessary to change the substrate 11 with respect to each screen size. There, the light-emission element module 1 is preferable configured to correspond to the desired display screen by preparing various kinds of light-emission element modules on which several to several tens of light-emission element parts 2 are mounted, and combining the light-emission element modules based on the screen size. For example, basic three kinds of light-emission element modules having the five, six and eight light-emission element parts 2, respectively are prepared to correspond to various kinds of display screen sizes. In this case, the size of each module can be small, and the number of light-emission element parts 2 mounted on each module can be reduced, so that the light-emission element module 1 can be produced without lowering its yield. The basic light-emission element modules are connected by a jumper lead or a connector to constitute the light-emission element module 1. Configurations of the light-emission element part 2 and the optical lens 21 and a method for fixing them to the substrate in the basic light-emission element module are the same as the light-emission element module 1 in the first and second embodiments, their descriptions are omitted.

The present invention can be applied to the surface-emission unit composed of the light-emission element module on which the light-emission element is mounted, and especially can be applied to a backlight for a liquid crystal display device such as a liquid crystal television or a liquid crystal monitor, and a lighting equipment.

Although the present invention has been described in terms of the preferred embodiment, it will be appreciated that various modifications and alternations might be made by those skilled in the art without departing from the spirit and scope of the invention. The invention should therefore be measured in terms of the claims which follow.

What is claimed is:

1. A surface-emission unit comprising:
    a plurality of light-emission element parts each including a light-emission element, aligned and arranged on a substrate two-dimensionally; and
    a plurality of optical lenses each arranged on the substrate with respect to each of the light-emission element parts, the optical lenses being configured to diffuse light from the light-emission element, wherein
    each of the optical lens is fixed to the substrate through one or more support parts, and
    each of the support parts is arranged, such that none of the support parts of the light-emission element parts arranged in a horizontal direction completely overlap a line connecting the light-emission element parts arranged in the horizontal direction, and none of the support parts of the light-emission elements parts arranged in a vertical direction completely overlap a line connecting the light-emission element part arranged in the vertical direction in a part or a whole of a region in which the light-emission element parts are aligned and arranged two-dimensionally.

2. The surface-emission unit according to claim 1, wherein each of the support parts is arranged so as not to overlap all lines connecting the light-emission element part corresponding to the optical lens fixed to the substrate by each of the support parts, to other light-emission element parts adjacent to the light-emission element part, in a part or a whole of a region in which the light-emission element parts are aligned and arranged two-dimensionally.

3. The surface-emission unit according to claim 1, wherein each of the support parts is arranged so as not to overlap a region of a projection width of an emission part of the light-emission element part on the line which is not overlapped with each of the support parts.

4. The surface-emission unit according to claim 1, wherein the support part includes a bonding resin to fix the optical lens onto the substrate.

5. The surface-emission unit according to claim 1, wherein the support part includes one or more poles of the optical lens projecting from a periphery part of the optical lens toward the substrate.

6. The surface-emission unit according to claim 1, wherein the light-emission element part is composed of the light-emission element sealed with a transparent resin.

7. A method for producing the surface-emission unit, comprising:
    preparing a plurality of light-emission element parts, each including a light-emission element;
    preparing a substrate having a wiring and a plurality of lands to mount the plurality of light-emission element parts on the substrate;
    preparing an optical lens for each of the plurality of light-emission element parts;
    aligning and arranging the plurality of light-emission element parts on the plurality of lands of the substrate two-dimensionally; and
    fixing each optical lens on the substrate through one or more support parts with respect to each of the light-emission element parts, wherein
    each of the support parts is arranged, such that none of the support parts of the light-emission element parts arranged in a horizontal direction completely overlap a line connecting the light-emission element parts arranged in the horizontal direction, and none of the support parts of the light-emission elements parts arranged in a vertical direction completely overlap a line connecting the light-emission element part arranged in the vertical direction in a part or a whole of a region in which the light-emission element parts are aligned and arranged two-dimensionally, in the step of fixing the optical lens.

8. The method for producing the surface-emission unit according to claim 7, wherein
    a bonding position of a bonding resin is arranged so as not to overlap at least one line connecting the light-emission element part corresponding to the optical lens bonded onto the substrate with the bonding resin, to another light-emission element part adjacent to the light-emission element part, in a part or a whole of a region in which the light-emission element parts are aligned and arranged two-dimensionally, in the step of fixing the optical lens.

9. The method for producing the surface-emission unit according to claim 7, wherein
    the optical lens having one or more poles projecting from a periphery part toward the substrate direction is prepared, in the step of preparing the optical lens, and
    each of the one or more poles of the optical lens is arranged so as not to overlap at least one line connecting the light-emission element part corresponding to the optical lens fixed onto the substrate by each of the support parts, to another light-emission element part adjacent to the light-emission element part, in a part or a whole of a region in which the light-emission element parts are aligned and arranged two-dimensionally, in the step of fixing the optical lens.

10. The method for producing the surface-emission unit according to claim 7, wherein
    each of the support parts is arranged so as not to overlap a region of a projection width of an emission part of the light-emission element part on the line which is not overlapped with each of the support parts, in the step of fixing the optical lens.

* * * * *